United States Patent
Nozawa et al.

(10) Patent No.: US 8,052,887 B2
(45) Date of Patent: Nov. 8, 2011

(54) SUBSTRATE PROCESSING APPARATUS

(75) Inventors: Toshihisa Nozawa, Amagasaki (JP); Tamaki Yuasa, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/689,815

(22) Filed: Jan. 19, 2010

(65) Prior Publication Data

US 2010/0116789 A1      May 13, 2010

Related U.S. Application Data

(63) Continuation of application No. 10/787,204, filed on Feb. 27, 2004, now abandoned.

(30) Foreign Application Priority Data

Feb. 27, 2003   (JP) ............................... P2003-052080

(51) Int. Cl.
    *C23C 16/44*     (2006.01)
    *C23C 16/00*     (2006.01)

(52) U.S. Cl. .......... 216/67; 427/569; 134/1.1; 134/22.1; 156/345.54

(58) Field of Classification Search ........................ None
See application file for complete search history.

(56) References Cited

U.S. PATENT DOCUMENTS

| | | | |
|---|---|---|---|
| 5,223,113 A | 6/1993 | Kaneko et al. | |
| 5,234,527 A | 8/1993 | Nozawa et al. | |
| 5,449,411 A | 9/1995 | Fukuda et al. | |
| 5,520,743 A | 5/1996 | Takahashi | |
| 5,562,947 A * | 10/1996 | White et al. | 427/255.5 |
| 5,858,258 A * | 1/1999 | Kojima et al. | 216/67 |
| 5,897,380 A * | 4/1999 | White et al. | 438/780 |
| 6,103,069 A * | 8/2000 | Davenport | 204/192.12 |
| 6,156,151 A | 12/2000 | Komino et al. | |
| 6,162,323 A | 12/2000 | Koshimizu | |
| 6,192,898 B1 * | 2/2001 | Aitani et al. | 134/1.1 |
| 6,258,170 B1 * | 7/2001 | Somekh et al. | 118/715 |
| 6,402,847 B1 | 6/2002 | Takagi et al. | |
| 6,787,054 B2 | 9/2004 | Wang et al. | |
| 6,787,481 B2 * | 9/2004 | Asai et al. | 438/785 |
| 6,797,188 B1 | 9/2004 | Shen et al. | |
| 6,835,278 B2 * | 12/2004 | Selbrede et al. | 156/345.35 |
| 6,857,388 B2 | 2/2005 | Lee et al. | |
| 7,037,376 B2 * | 5/2006 | Harvey et al. | 118/715 |
| 7,160,812 B2 * | 1/2007 | Hamada | 438/706 |
| 2001/0047849 A1 | 12/2001 | Jiwari et al. | |
| 2002/0020429 A1 * | 2/2002 | Selbrede et al. | 134/1.1 |
| 2002/0028566 A1 | 3/2002 | Yano | |

(Continued)

FOREIGN PATENT DOCUMENTS

EP      0751554      1/1997

(Continued)

*Primary Examiner* — Allan Olsen
(74) *Attorney, Agent, or Firm* — Finnegan, Henderson, Farabow, Garrett & Dunner, L.L.P.

(57) ABSTRACT

When plasma processing is finished, a gate valve 13a is closed and cleaning gas is ejected from holes 121a of a shower plate 121, and at the same time, a microwave is generated from a microwave generator 101. Further, at this time, the inside of a process chamber 110 is exhausted through a second exhaust port 106. Since the exhaust is conducted through a second exhaust port 106 positioned lower than a wafer stage 104 in a lowered state when the inside of the process chamber 110 is cleaned, it is possible to more effectively remove gas and reaction products deposited especially in a lower portion of the process chamber 110.

5 Claims, 3 Drawing Sheets

U.S. PATENT DOCUMENTS

| | | |
|---|---|---|
| 2002/0066535 A1 | 6/2002 | Brown et al. |
| 2003/0033978 A1* | 2/2003 | Zhao et al. ................... 118/715 |
| 2003/0198754 A1 | 10/2003 | Xi et al. |
| 2003/0211735 A1 | 11/2003 | Rossman |
| 2004/0052972 A1 | 3/2004 | Schmitt |
| 2004/0144490 A1 | 7/2004 | Zhao et al. |
| 2004/0168768 A1* | 9/2004 | Nozawa et al. .......... 156/345.29 |
| 2004/0200499 A1* | 10/2004 | Harvey et al. .................. 134/1.1 |
| 2005/0229849 A1* | 10/2005 | Silvetti et al. ................. 118/715 |
| 2007/0051312 A1* | 3/2007 | Sneh ............................. 118/719 |
| 2007/0111519 A1* | 5/2007 | Lubomirsky et al. ......... 438/678 |
| 2009/0005630 A1* | 1/2009 | Yokoyama et al. ........... 588/321 |
| 2009/0068356 A1* | 3/2009 | Silvetti et al. ............... 427/248.1 |
| 2009/0321743 A1* | 12/2009 | Isa et al. .......................... 257/66 |
| 2010/0116789 A1* | 5/2010 | Nozawa et al. ................. 216/67 |
| 2010/0166957 A1* | 7/2010 | Sneh ........................ 427/255.28 |

FOREIGN PATENT DOCUMENTS

| | | |
|---|---|---|
| JP | 09-168732 | 6/1997 |

* cited by examiner

SUBSTRATE PROCESSING APPARATUS

CROSS REFERENCE TO RELATED APPLICATIONS

This application is a continuation of application Ser. No. 10/787,204, filed Feb. 27, 2004, now abandoned which claims benefit of priority to Japanese Patent Application No. 2003-052080, filed in the Japanese Patent Office on Feb. 27, 2003, the entire disclosures of which are incorporated herein by reference.

BACKGROUND OF THE INVENTION

1. Field of the Invention

The present invention relates to a substrate processing apparatus that applies film deposition, an etching process, or the like on, for example, a semiconductor wafer by plasma processing.

2. Description of the Related Art

In a substrate processing apparatus such as a CVD (Chemical Vapor Deposition) apparatus, which applies film deposition on a substrate such as a semiconductor wafer (hereinafter, simply referred to as a wafer) and a glass substrate for a LCD (Liquid Crystal Display), and an etching apparatus that applies an etching process on such a substrate, the inside of a process chamber is exhausted via an exhaust port disposed, for example, in a lower portion thereof while plasma process gas is being introduced from above the substrate.

In such a substrate processing apparatus, $SiO_2$, SiN, SiOCH, CF polymer, and the like (reaction products) stay to be deposited in the process chamber after the plasma processing. Such deposits are problematic since they float in the process chamber thereafter to adhere to the substrate. Therefore, the inside of the process chamber is exhausted after the plasma processing, using the aforesaid exhaust port. Such a substrate processing apparatus is disclosed in, for example, Japanese Patent Laid-open No. Hei 9-168732 (see FIG. 1, [0008], and so on).

The above-described substrate processing apparatus, however, has a problem that the gas flow on the substrate surface is disturbed because the exhaust port is provided in the lower portion of the process chamber, so that process uniformity is not maintained.

Here, a possible measure for solving the problem may be, for example, disposing the exhaust port as close as possible to the substrate surface, but this structure has a problem that the reaction products stay to be deposited in the lower portion of the process chamber (for example, on a side face and a bottom side of a process stage, a lower portion of a stay of the process stage, and so on).

SUMMARY OF THE INVENTION

The present invention is made under such circumstances, and an object thereof is to provide a substrate processing apparatus that realizes the removal of reaction products deposited in a process chamber while maintaining process uniformity.

In order to solve the problems stated above, a substrate processing apparatus according to a main aspect of the present invention includes: a process chamber in which a substrate is plasma-processed; a gas introducing mechanism configured to introduce gas into the process chamber; a first exhaust mechanism having a first exhaust port provided at a first position in the process chamber, and configured to exhaust the inside of the process chamber when gas for plasma processing is introduced into the process chamber by the gas introducing mechanism to plasma-process the substrate; and a second exhaust mechanism having a second exhaust port provided at a second position that is lower than the first position in the process chamber, and configured to exhaust the inside of the process chamber when gas for cleaning is introduced into the process chamber by the gas introducing mechanism to clean the inside of the process chamber.

Another substrate processing apparatus according to a main aspect of the present invention includes: a process chamber in which a substrate is plasma-processed; a gas introducing mechanism configured to introduce gas for plasma processing and gas for cleaning into the process chamber; a holding mechanism having a surface provided in the process chamber and configured to horizontally hold the substrate on the surface; a first exhaust mechanism having a first exhaust port positioned higher than the surface of the holding mechanism in the process chamber, and configured to exhaust the inside of the process chamber; and a second exhaust mechanism having a second exhaust port positioned lower than the holding mechanism in the process chamber, and configured to exhaust the inside of the process chamber.

In the substrate processing apparatus as configured above, gas is discharged via the first exhaust port during the plasma processing. Maintaining process uniformity is made possible by the structure such that the first exhaust port is positioned at the same height as or higher than, for example, the surface of the substrate undergoing the process. Meanwhile, while the inside of the process chamber is being cleaned, gas is discharged via the second exhaust port provided at a lower position than the first exhaust port in the process chamber. More effective removal of reaction products deposited in the process chamber is made possible by the structure such that the second exhaust port is positioned at, for example, a lower portion in the process chamber.

Here, when reactive gas is used as the gas for cleaning and a microwave is generated also when the inside of the process chamber is cleaned, the reaction products deposited in the lower portion of the process chamber can be removed by reactive cleaning.

As for the cleaning timing, cleaning may be conducted each time when the processing of one substrate is finished, or each time when the processing of a predetermined number of substrates is finished (batch by batch).

Further, the aforesaid first exhaust mechanism may be configured to exhaust the inside of the process chamber concurrently with the exhaust by the second exhaust mechanism when the gas for cleaning is introduced into the process chamber by the gas introducing mechanism to clean the inside of the process chamber. This configuration enables more effective exhaust. At this time, if the exhaust by the first exhaust mechanism is stopped first and the exhaust by the second exhaust mechanism is thereafter stopped, it is possible to effectively prevent the gas for cleaning from floating up.

DESCRIPTION OF THE EMBODIMENTS

Hereinafter, embodiments of the present invention will be explained with reference to the drawings.

Figure 1:
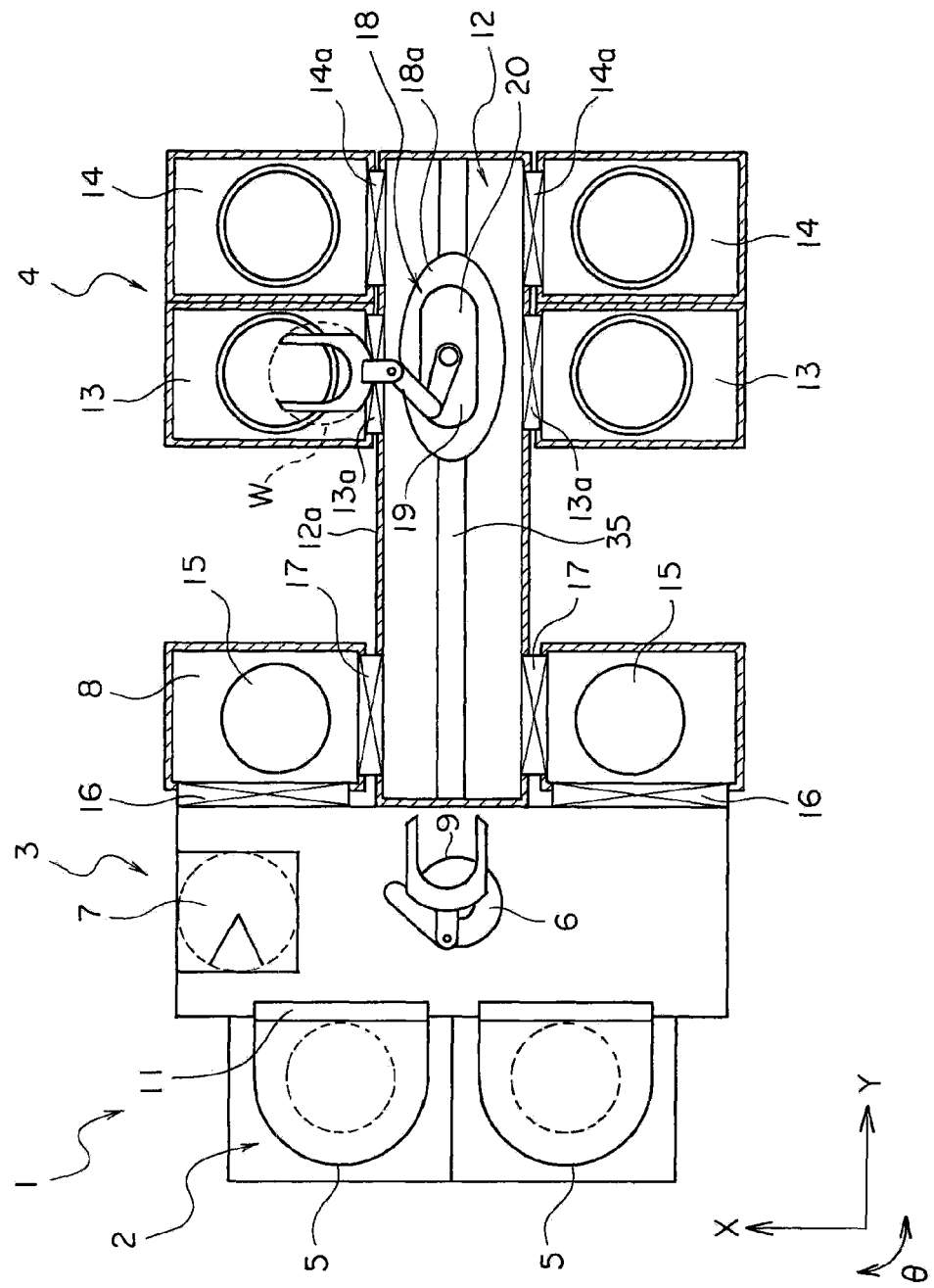
FIG. 1 is a plane view showing the configuration of a substrate processing system according to an embodiment of the present invention.
Figure 2:
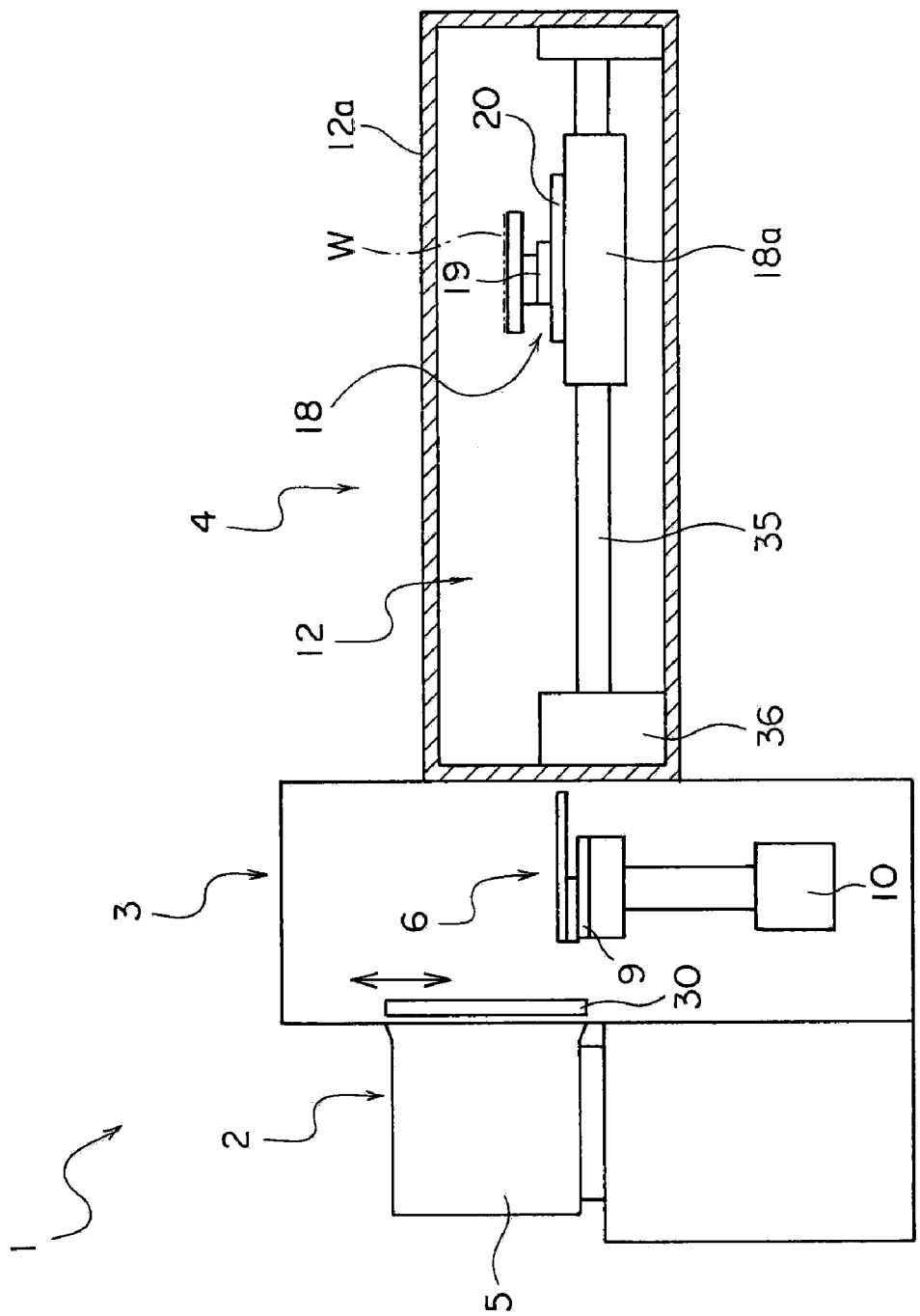
FIG. 2 is a side view showing the configuration of the substrate processing system shown in FIG. 1.

FIG. 1 is a plane view showing the configuration of a substrate processing system according to an embodiment of the present invention, and FIG. 2 is a side view thereof.

This substrate processing system 1 is composed of a cassette mounting table 2, a transfer chamber 3, and a vacuum process section 4, which are arranged linearly in a Y direction in the drawing.

A plurality of (for example, two) cassettes 5 are arranged on the cassette mounting table 2 in line in an X direction in the drawing. An example of the cassette 5 is a FOUP (Front Opening Unified Pod) having sealability in which a plurality of (for example, 25) wafers W are housed, being arranged in multiple tiers.

In the transfer chamber 3, a wafer transfer mechanism 6 constituted of a jointed-arm robot and a pre-alignment stage 7 are provided. The wafer transfer mechanism 6 takes out the wafer W from the cassette 5 to place the wafer W on the pre-alignment stage 7, and thereafter, loads the wafer W into one of load lock chambers 8 disposed on a vacuum process section 4 side. Further, the wafer transfer mechanism 6 takes out the wafer W from the load lock chamber 8 to put it in the cassette 5. The wafer transfer mechanism 6 is structured to be rotatable in a horizontal plane (in a θ direction) by a base portion 9. Further, as shown in FIG. 2, the wafer transfer mechanism 6 is structured to be movable up/down by an amount corresponding to the height of the cassette 5 by a motor 10. The pre-alignment stage 7 has a function of aligning the wafer W direction-wise in the horizontal plane.

Incidentally, a two-link jointed-arm robot is adopted as the wafer transfer mechanism 6 in this embodiment, but, for example, a 1-link jointed-arm robot may be adopted according to necessary stroke.

Further, the transfer chamber 3 has a shutter 11, which is openable/closable, for example, vertically, is provided in front of the cassette 5. This shutter 11 allows the wafer transfer mechanism 6 to access the cassettes 5. Further, the downflow of $N_2$ gas is formed under the atmospheric pressure in the transfer chamber 3.

The vacuum process section 4 has a transfer path 12 extending linearly along the Y direction in the drawing. One end of the transfer path 12 is adjacent to the transfer chamber 3. The load lock chambers 8, CVD units 13, and etching units 14 are arranged on both sides of the transfer path 12 along the transfer path 12 in sequence from the transfer chamber 3 side. This arrangement is an example, and the arrangement thereof is not limited to this arrangement. Further, the transfer path 12 is enclosed in a case 12a, and it is possible to bring the inside of the case 12a into a vacuum state when the pressure thereof is reduced by a not-shown vacuum pump.

A wafer mounting table 15 on which the wafer W is temporarily placed is provided substantially at the center of each of the load lock chambers 8. The load lock chambers 8 are connected to the transfer chamber 3 via respective gate valves 16, and also connected to the transfer path 12 via respective gate valves 17.

The CVD units 13 are connected to the transfer path 12 via respective gate valves 13a. Further, the etching units 14 are connected to the transfer path 12 via respective gate valves 14a.

A main wafer transfer mechanism 18 linearly movable along the Y direction is provided in the transfer path 12. The main wafer transfer mechanism 18 has a stage 18a linearly movable along the Y direction. The stage 18a is configured to be moved by a motor 36 along a rail 35 in the Y direction. As a driving mechanism thereof, for example, a belt-driving mechanism or the like is adoptable. A transfer robot 19 is disposed on this stage 18a. The transfer robot 19 is, for example, a 1-link, X-Y jointed-arm robot.

Next, the operation of the substrate processing system 1 as configured above will be explained.

First, the shutter 11 opens, and the wafer transfer mechanism 6 accesses the cassette 5 to take out one of the wafers W. The wafer W that has been taken out is transferred into the pre-alignment stage 7 to be pre-aligned. Thereafter, the wafer transfer mechanism 6 takes out the wafer W from the pre-alignment stage 7 to transfer it into the load lock chamber 8. In this case, the wafer transfer mechanism 6 places the wafer W on the mounting table 15.

In the load lock chamber 8, the wafer W is placed on the mounting table 15 to be kept on standby thereon. Thereafter, the gate valve 16 is closed. A not-shown vacuum pump exhausts the inside of the load lock chamber 8 to vacuum. This vacuum exhaust is conducted until the pressure reaches the same pressure as that of the inside of, for example, the transfer path 12, the CVD unit 13, and the etching unit 14 (for example, 20 Pa to 1330 Pa (about 0.1 Torr to about 10 Torr)).

When the pressure inside the load lock chamber 8 reaches 20 Pa to 1330 Pa, the gate valve 17 is opened, and the transfer robot 19 takes out the wafer W placed on the mounting table 15 to transfer the wafer W into the CVD unit 13.

Then, when a CVD process in the CVD unit 13 is finished, the gate valve 13a opens. Next, the transfer robot 19 accesses the CVD unit 13 to take out the wafer W. Further, it transfers the wafer W that has been taken out into the etching unit 14. Here, the wafer W is etch-backed so that the surface of a metal film formed by the CVD process is planarized.

Then, when the etch-back process in the etching unit 14 is finished, the gate valve 14a opens. Next, the transfer robot 19 accesses the etching unit 14 to take out the wafer W. It further transfers the wafer W that has been taken out into the load lock chamber 8 to place the wafer W on the mounting table 15.

When the pressure inside the load lock chamber 8 is made slightly higher than the atmospheric pressure after the wafer W is placed on the mounting table 15, the gate valve 16 is opened to make the inside of the load lock chamber 8 open to the atmosphere. In this manner, the flow of particles into the load lock chamber 8 can be prevented.

Thereafter, the wafer transfer mechanism 6 takes out the wafer W from the mounting table 15 in the load lock chamber 8 to return the wafer W to the cassette 5.

In the substrate processing system 1 as configured above, no rotating movement is made when the wafer W is transferred among the load lock chamber 8, the CVD unit 13, and the etching unit 14 by the linearly movable stage 18a and the transfer robot 19 being a transfer means, which allows improvement in footprint.

Figure 3:
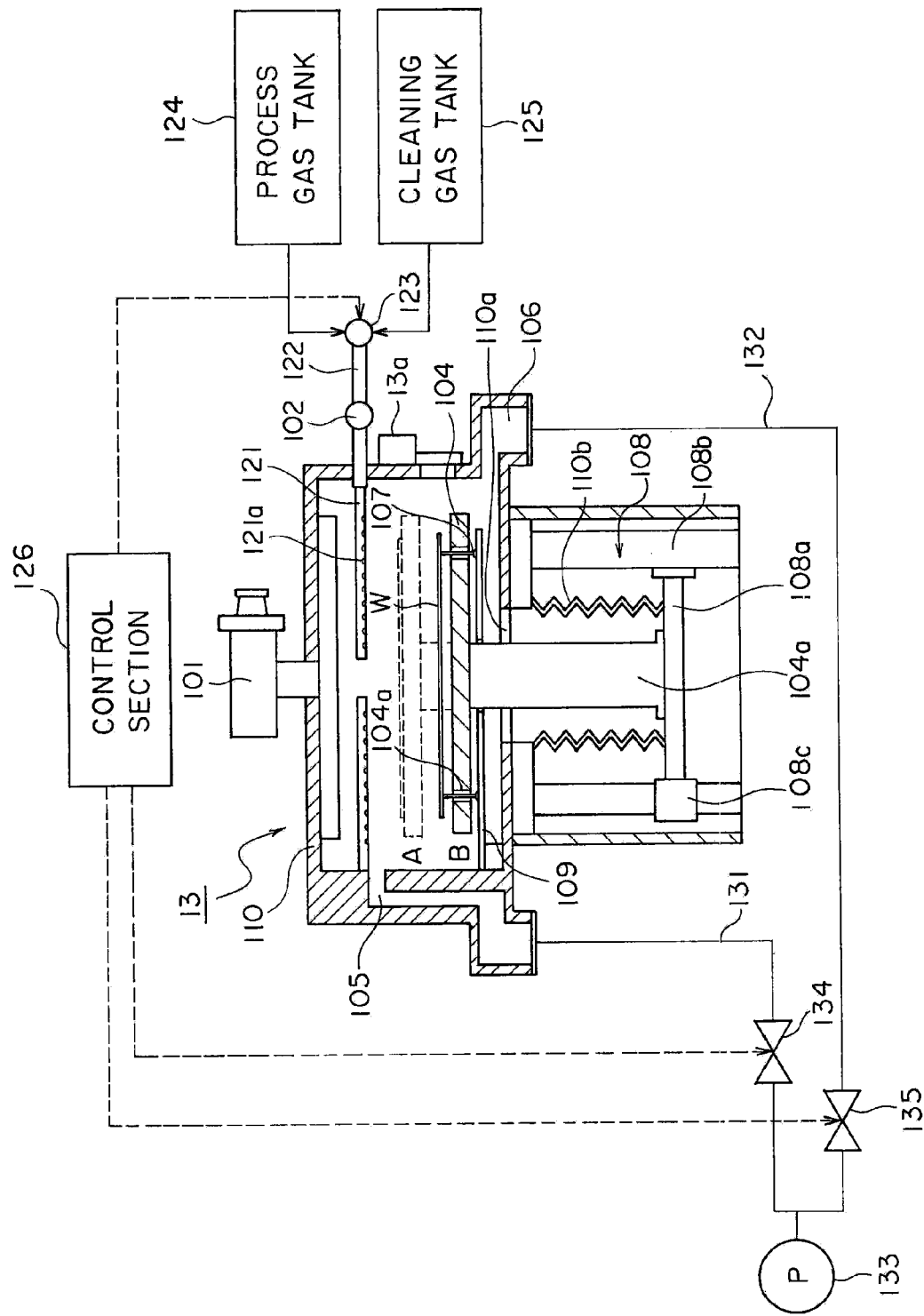
FIG. 3 is a schematic view showing the configuration of a CVD unit according to an embodiment of the substrate processing apparatus of the present invention.

FIG. 3 is a schematic view showing the configuration of the CVD unit 13 according to an embodiment of the substrate processing apparatus of the present invention.

As shown in FIG. 3, a wafer stage 104 as a holding mechanism configured to hold a wafer W is disposed in a process chamber 110 forming a sealed space. A hoisting/lowering mechanism 108 provided on the bottom of the process chamber 110 allows the wafer stage 104 to move up/down.

A support rod 104a extending downward from a rear face of the wafer stage 104 passes through an opening 110a provided in the bottom of the process chamber 110 to protrude downward. A holding plate 108a in the hoisting/lowering mechanism 108 holds a lower end of the aforesaid support rod 104a. The holding plate 108a is driven to move up/down by a cylinder 108b connected to one end thereof. Further, the holding plate 108a is guided by a guide member 108c that guides the aforesaid ascent/descent on a side opposite a portion thereof to which the cylinder 108b is connected. Note that the opening 110a is configured to be sealed by a bellows-shaped seal member 110b.

A pin holding member 109 holding a plurality of (for example, three) support pins 107 for supporting the wafer W is disposed on a rear face side of the wafer stage 104. The support pins 107 are inserted in through holes 104a penetrating the wafer stage 104 from the front face to the rear face. The ascent/descent of the wafer stage 104 causes the support pins 107 inserted in the through holes 104a to protrude/retreat from the surface of the wafer stage 104.

Above the wafer stage 104, disposed is a shower plate 121 having a large number of holes 121a from which process gas and cleaning gas are ejected toward the wafer stage 104. An electronic switching three-way valve 123 is connected to the shower plate 121 via a pipe 122. The three-way valve 123 has a first input connected to a process gas tank 124 in which the process gas is stored, and a second input connected to a cleaning gas tank 125 in which the cleaning gas is stored. $SiH_4+N_2O$, TEOS (Tetra Ethoxy Silane)$+O_2$, and so on are examples of the process gas. $Ar+O_2$, $Ar+NF_3$, and so on are examples of the cleaning gas. The three-way valve 123 is switched over by a control section 126.

A microwave generator 101 that generates a microwave for plasma processing is provided above the process chamber 110.

A first exhaust port 105 is provided in a sidewall of an upper portion of the process chamber 110. The first exhaust port 105 is provided in plurality so as to surround the outer periphery of the wafer stage 104. These first exhaust ports 105 are positioned higher than the surface of the wafer stage 104 in a lifted state (position of A shown by the dotted line in FIG. 3). A second exhaust port 106 is provided in a sidewall of a lower portion of the process chamber 110. The second exhaust port 106 is positioned lower than the wafer stage 104 in a lowered state (position of B shown by the solid line in FIG. 3). The second exhaust port 106 is provided at, for example, one place. The first exhaust ports 105 and the second exhaust port 106 are connected to a common pump 133 via pipes 131, 132 respectively. Open/close valves 134, 135 are disposed in the middle of the pipes 131, 132 respectively. The opening/closing of the open/close valves 134, 135 is controlled by the control section 126.

Note that not-shown temperature regulators are provided on the wafer stage 104 and on the wall of the process chamber 110 so that the temperature can be adjusted to the temperature necessary for the processing.

Next, the operation in the CVD unit 13 as configured above will be explained.

The gate valve 13a opens when the wafer stage 104 is in the lowered state (position of B shown by the solid line in FIG. 3), and the main wafer transfer mechanism 18 shown in FIG. 1 delivers the wafer W onto the support pins 107 protruding from the surface of the wafer stage 104.

Next, the gate valve 13a is closed and the wafer stage 104 moves up to the position of A in FIG. 3 (shown by the dotted line).

Next, the process gas is ejected from the holes 121a of the shower plate 121 and at the same time, the microwave is generated from the microwave generator 101. Further, at this time, the inside of the process chamber 110 is exhausted through the first exhaust ports 105. Through these processes, a thin film of $SiO_2$, SiN, SiOCH, or the like is formed on the wafer W by plasma processing. At this time, since the first exhaust ports 105 are positioned higher than the surface of the wafer W, uniformity of the process applied to the wafer W can be maintained. Consequently, the thin film formed on the surface of the wafer W can be made uniform.

Next, the above-mentioned gas ejection, microwave generation, and exhaust are stopped, the wafer stage 104 (positioned at B shown by the solid line in FIG. 3) moves down thereafter, the gate valve 13a opens, and the wafer W is delivered to the main wafer transfer mechanism 18 shown in FIG. 1 from the support pins 107 protruding from the surface of the wafer stage 104.

When such processes are finished, the gate valve 13a is closed again, and the cleaning gas is ejected from the holes 121a of the shower plate 121, and at the same time, the microwave is generated from the microwave generator 101. At this time, the inside of the process chamber 110 is exhausted through the second exhaust port 106. Through these processes, the process chamber 110 is plasma-cleaned.

Such cleaning may be conducted each time when the processing of one wafer W is finished or may be conducted each time the processing of one batch (for example, 25 wafers) is finished. Alternatively, it may be conducted at a different timing.

In this embodiment, it is made possible to more effectively remove gas and reaction products deposited especially in the lower portion of the process chamber 110 especially because the exhaust is conducted through the second exhaust port 106 positioned lower than the wafer stage 104 in the lowered state when the inside of the process chamber 110 is cleaned.

It should be noted that the present invention is not to be limited to the above-described embodiments.

In the explanation of the above-described embodiments, the cleaning gas is reactive gas, but nonreactive gas (Ar, $N_2$) may be used as the cleaning gas. In this case, the generation of the microwave is not required in the cleaning process.

Further, in the above-described embodiments, the exhaust is conducted only through the second exhaust port 106 in the cleaning process, but the exhaust may be conducted also through the first exhaust port 105 concurrently.

In addition, in the explanation of the above-described embodiments, the CVD unit is taken as an example of the substrate processing apparatus, but the present invention is also applicable to other substrate processing apparatus such as an etching unit and so on.

Further, in the foregoing explanation, the semiconductor wafer is taken as an example of the substrate, but of course, the present invention is also applicable to cases where a glass substrate, a CD substrate, and the like are used.

As is explained hitherto, according to the present invention, it is possible to remove reaction products deposited in a process chamber while maintaining process uniformity.

What is claimed is:

1. A method for processing a substrate, comprising:
   delivering said substrate to be plasma-processed onto a holding mechanism in a process chamber;
   introducing a process gas into said process chamber while an inside of said process chamber is evacuated by a first exhaust port in said process chamber;
   plasma-processing said substrate; and
   introducing, after said substrate is plasma-processed, a cleaning gas into said process chamber while the inside of said process chamber is evacuated by a second exhaust port positioned lower than said first exhaust port in said process chamber, thereby cleaning the inside of said process chamber,
   wherein said holding mechanism is moved upward when said substrate is plasma-processed so that said first exhaust port is positioned higher than said holding mechanism, and moved downward when the inside of said process chamber is cleaned so that the second exhaust port is positioned lower than said holding mechanism.

2. The method as set forth in claim 1, wherein the inside of said process chamber is exhausted by the first and the second exhaust ports when said cleaning gas is introduced into said process chamber.

3. The method as set forth in claim 2, wherein the exhaust by the first exhaust port is stopped first and the exhaust by the second exhaust port is thereafter stopped.

4. The method as set forth in claim 1, wherein said cleaning gas is a reactive gas.

5. The method as set forth in claim 4, further comprising:
supplying a microwave into said process chamber when the inside of said process chamber is cleaned.

* * * * *